United States Patent
Abe

(10) Patent No.: US 8,712,709 B2
(45) Date of Patent: Apr. 29, 2014

(54) DELTA-SIGMA AD CONVERTER CIRCUIT AND BATTERY PACK

(75) Inventor: Makio Abe, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 307 days.

(21) Appl. No.: 13/144,117

(22) PCT Filed: Jan. 12, 2010

(86) PCT No.: PCT/JP2010/050224
§ 371 (c)(1),
(2), (4) Date: Jul. 12, 2011

(87) PCT Pub. No.: WO2010/082565
PCT Pub. Date: Jul. 22, 2010

(65) Prior Publication Data
US 2011/0270552 A1   Nov. 3, 2011

(30) Foreign Application Priority Data

Jan. 14, 2009   (JP) ................. 2009-006162

(51) Int. Cl.
*G01R 31/36* (2006.01)
(52) U.S. Cl.
USPC ................. 702/63; 341/27; 341/143
(58) Field of Classification Search
USPC .......................................................... 702/63
See application file for complete search history.

(56) References Cited

U.S. PATENT DOCUMENTS

| | | | |
|---|---|---|---|
| 5,321,400 A | | 6/1994 | Sasaki et al. |
| 5,606,242 A | * | 2/1997 | Hull et al. ............ 320/106 |
| 5,774,733 A | * | 6/1998 | Nolan et al. .......... 713/300 |
| 5,955,869 A | * | 9/1999 | Rathmann ............ 320/132 |
| 6,025,695 A | * | 2/2000 | Friel et al. ........... 320/106 |
| 6,317,067 B1 | * | 11/2001 | Mohindra ............ 341/145 |
| 2007/0188133 A1 | | 8/2007 | Nakano et al. |
| 2007/0188146 A1 | * | 8/2007 | Nakano et al. ...... 320/132 |
| 2007/0189400 A1 | | 8/2007 | Nakano et al. |
| 2011/0254131 A1 | * | 10/2011 | Itagaki ................ 257/533 |

FOREIGN PATENT DOCUMENTS

| | | |
|---|---|---|
| JP | 1-314023 | 12/1989 |
| JP | 6-028313 | 2/1994 |
| JP | 9-307451 | 11/1997 |
| JP | 2007-240523 | 9/2007 |
| JP | 2007-243620 | 9/2007 |
| JP | 2007-243931 | 9/2007 |

OTHER PUBLICATIONS

International Search Report mailed on Mar. 23, 2010.

* cited by examiner

*Primary Examiner* — Sujoy Kundu
*Assistant Examiner* — Alvaro Fortich
(74) *Attorney, Agent, or Firm* — IPUSA, PLLC

(57) ABSTRACT

A delta-sigma AD converter circuit includes a plurality of registers to store plural data obtained by dividing data stored in the shift register and to hold the plural data in such a form that each of the plural data is readable independently of the others, wherein one or more of the plurality of registers store the pulse density modulated data stored in the shift register in response to the register store instruction signal, and the filtering unit reads the pulse density modulated data from one or more of the plurality of registers responsive to the mode in response to the read request signal.

11 Claims, 5 Drawing Sheets

US 8,712,709 B2

DELTA-SIGMA AD CONVERTER CIRCUIT AND BATTERY PACK

TECHNICAL FIELD

The disclosures herein generally relate to delta-sigma AD converter circuits and battery packs, and particularly relate to a delta-sigma AD converter circuit and a battery pack provided with a delta-sigma AD converter circuit for converting an analog signal into a digital signal.

BACKGROUND ART

In recent years, battery packs utilizing lithium ion batteries have been used in portable apparatuses such as digital cameras. In general, it is arguably difficult to detect a remaining battery level based on the voltage level of a lithium ion battery. Because of this, a method of measuring a remaining battery level uses a microcomputer or the like to detect charge and discharge currents of a battery and to integrate the detected charge and discharge currents.

A fuel gauge IC for measuring a remaining battery level as described above includes an analog circuit such as a high-precision AD converter circuit and a digital circuit such as a timer and a CPU for integrating measured current values. Such an analog circuit and a digital circuit are implemented as a single-chip semiconductor integrated circuit device.

One example of the AD converter to convert an analog signal into a digital signal in the above-noted analog circuit is a delta-sigma AD converter circuit (see Patent Document 1, for example).

RELATED-ART DOCUMENTS

Patent Document

[Patent Document 1] Japanese Patent Application Publication No. 9-307451

SUMMARY OF THE INVENTION

Problem to be Solved by Invention

In a fuel gauge IC, the CPU operates at high speed when the battery pack discharges upon being connected to a portable apparatus, or when the battery pack is charged. When the battery pack is not connected to a portable apparatus, on the other hand, the CPU operates at low speed.

A delta-sigma AD converter circuit includes a modulation unit to produce pulse density modulated data by pulse density modulation of an analog signal, and includes a filtering unit to convert the pulse density modulated data into pulse code modulated data that is digital data. Processing by this filtering unit may be performed by a CPU. In such a configuration, it is preferable to reduce the number of bits of the pulse density modulated data that is supplied from the modulation unit of the delta-sigma AD converter circuit to the CPU for performing filtering when the CPU is operating at high speed. Further, it is preferable to increase the number of bits of the pulse density modulated data that is supplied from the modulation unit to the CPU for performing filtering when the CPU is operating at low speed.

In consideration of the above, it may be desirable to provide a delta-sigma AD converter circuit that can change the number of bits of pulse density modulated data supplied from the modulation unit to the filtering unit in response to the operation speed of the filtering unit.

Means to Solve the Problem

According to one embodiment, a delta-sigma AD converter circuit includes a modulation unit to produce pulse density modulated data by pulse density modulation of an analog signal, and a filtering unit to convert the pulse density modulated data into pulse code modulated data, wherein the modulation unit includes a shift register to store and shift the pulse density modulated data in synchronization with a clock, a counter to generate a register store instruction signal and a read request signal upon a count value reaching a predetermined value responsive to a mode, the count value being a count of a number of shifts of the shift register, and a plurality of registers to store plural data obtained by dividing data stored in the shift register and to hold the plural data in such a form that each of the plural data is readable independently of the others, wherein one or more of the plurality of registers store the pulse density modulated data stored in the shift register in response to the register store instruction signal, and the filtering unit reads the pulse density modulated data from one or more of the plurality of registers responsive to the mode in response to the read request signal.

According to another embodiment, a battery pack includes a battery, a current sensor to detect charge and discharge currents of the battery, a delta-sigma modulator to produce pulse density modulated data by pulse modulation of an analog signal generated by the current sensor, and a CPU to obtain digital values of the charge and discharge currents based on the pulse density modulated data, wherein the delta-sigma modulator includes a shift register to store and shift the pulse density modulated data in synchronization with a clock, a counter to generate a register store instruction signal and a read request signal upon a count value reaching a predetermined value responsive to a mode, the count value being a count of a number of shifts of the shift register, and a plurality of registers to store plural data obtained by dividing data stored in the shift register and to hold the plural data in such a form that each of the plural data is readable independently of the others, wherein one or more of the plurality of registers store the pulse density modulated data stored in the shift register in response to the register store instruction signal, and wherein the CPU reads the pulse density modulated data from one or more of the plurality of registers responsive to the mode in response to the read request signal, and calculates a remaining battery level of the battery based on the digital values of the charge and discharge currents obtained based on the read pulse density modulated data.

Advantage of the Invention

According to the present invention, provision is made to change the number of bits of pulse density modulated data supplied from the modulation unit to the filtering unit in response to the operation speed of the filtering unit.

MODE FOR CARRYING OUT THE INVENTION

In the following, embodiments of the invention will be described with reference to the accompanying drawings.

<Embodiment of Delta-Sigma AD Converter Circuit>

Figure 1:
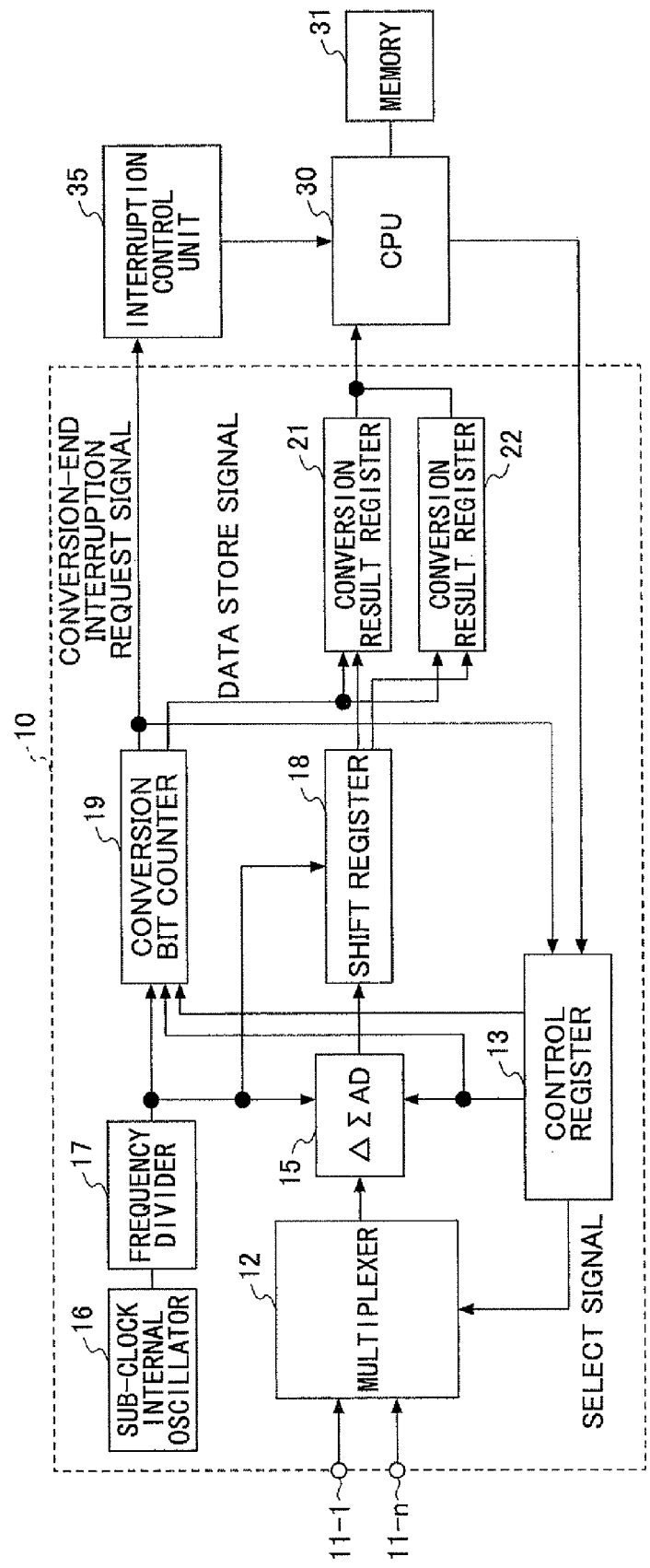
FIG. 1 is a block diagram illustrating an embodiment of a delta-sigma AD converter circuit according to the invention.

FIG. 1 is a block diagram illustrating an embodiment of a delta-sigma AD converter circuit according to the invention. In FIG. 1, the delta-sigma AD converter circuit includes a modulation unit 10, a CPU 30, a memory 31, and an interruption control unit 35. The CPU 30 corresponds to a filtering unit.

Analog signals applied to terminals 11-1 through 11-n of the modulation unit 10 are supplied to a multiplexer 12. The multiplexer 12 selects one of the analog signals input through the terminals 11-1 through 11-n based on a select signal from a control register 13 for provision to a delta-sigma modulator 15.

A sub-clock internal oscillator 16 generates a sub-clock of 38.4-kHz frequency, for example. This sub-clock is ¼ frequency divided by a frequency divider 17 into a clock of 9.6-kHz frequency. The frequency-divided clock is supplied to the delta-sigma modulator 15, a shift register 18, and a conversion bit counter 19.

Upon receiving a conversion start signal from the control register 13, the delta-sigma modulator 15 starts pulse density modulation (PDM) with respect to an analog signal supplied from the multiplexer 12. The delta-sigma modulator 15 produces a one-bit digital-modulated signal by use of the pulse density modulation. The signal output from the delta-sigma modulator 15 is supplied to the shift register 18.

The conversion bit counter 19 receives from the control register 13 the conversion start signal and a mode signal indicative of either a 32-bit mode or a 16-bit mode. The conversion bit counter 19 starts a counting operation in response to a high level of the conversion start signal, for example. The conversion bit counter 19 counts 32 pulses or 16 pulses depending on the mode signal, followed by producing a data store signal and a conversion-end interruption request signal serving as a read request signal. The conversion bit counter 19 supplies the conversion-end interruption request signal to the control register 13 and to the interruption control unit 35, and supplies the data store signal to conversion result registers 21 and 22.

The control register 13 is set by the CPU to store settings indicating either the 32-bit mode or the 16-bit mode, whether to reset the conversion start signal, etc. In response to the settings indicating either the 32-bit mode or the 16-bit mode and whether to reset the conversion start signal, the control register 13 supplies the conversion start signal and a mode signal to the delta-sigma modulator 15 and the conversion bit counter 19, respectively.

Upon receiving the conversion-end interruption request signal from the conversion bit counter 19, the control register 13 resets the conversion start signal when its settings indicate the resetting of the conversion start signal. When the settings indicate no resetting of the conversion start signal, the control register 13 does not reset the conversion start signal.

The shift register 18 has a 32-bit width. The shift register 18 stores and shifts one-bit digital signal from the delta-sigma modulator 15 in synchronization with the clock. The upper 16 bits of the shift register 18 are supplied to the conversion result register 21 as parallel data, and the lower bits are supplied to the conversion result register 22 as parallel data.

Upon receiving a read request from the CPU 30, the conversion result registers 21 and 22 supplies the 16-bit pulse density modulated data stored therein to the CPU 30 via a 16-bit width bus.

The CPU 30 sets the control register 13 to store a setting indicating the 16-bit mode when a high-speed operation is being performed. The CPU 30 sets the control register 13 to store a setting indicating the 32-bit mode when a low-speed operation is being performed.

Upon receiving the conversion-end interruption request signal from the interruption control unit 35, the CPU 30 successively reads the pulse density modulated data stored in the conversion result registers 21 and 22 (32 bits in total) in the case of the 32-bit mode. In the case of the 16-bit mode, the CPU 30 only receives the pulse density modulated data (16 bits) stored in the conversion result register 21. The CPU 30 performs filtering, i.e., decimation filtering, to convert the pulse density modulated data into pulse code modulated data that is a digital signal. It may be noted that a decimation filtering program executed by the CPU 30 is stored in the memory 31.

The interruption control unit 35 receives a plurality of interruption request signals in addition to the conversion-end interruption request signal supplied from the conversion bit counter 19. When plural interruption requests occur simultaneously, the interruption control unit 35 selects the highest-priority interruption request, and sends the interruption request to the CPU 30.

<Delta-Sigma Modulator>

Figure 2:
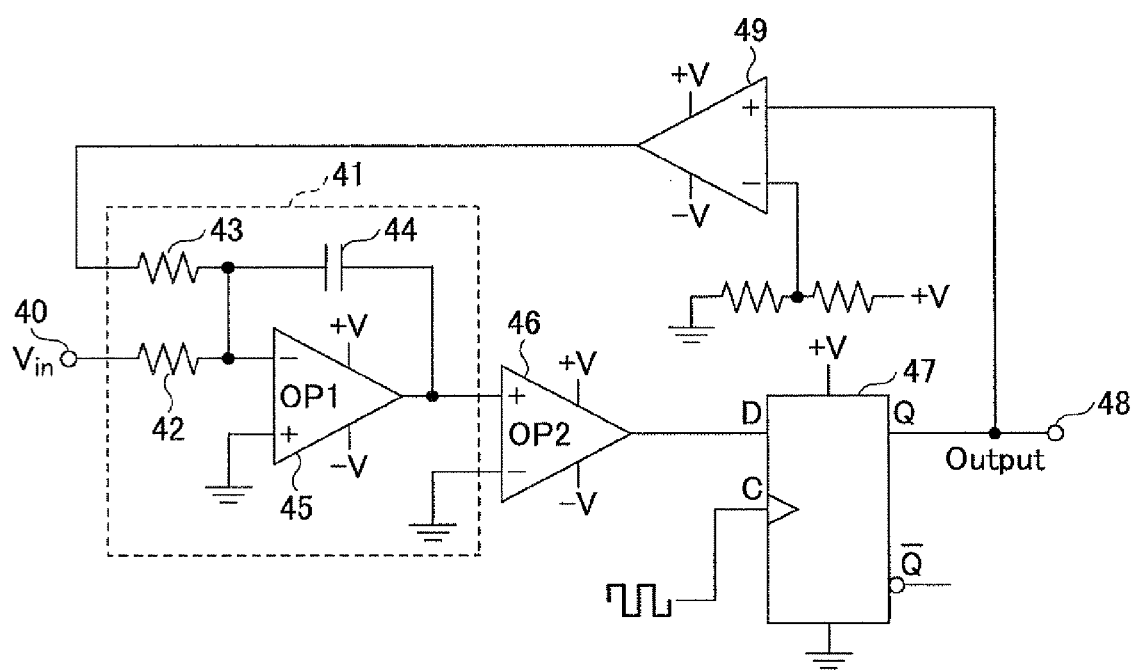
FIG. 2 is a block diagram illustrating an embodiment of the delta-sigma modulator.

FIG. 2 is a block diagram illustrating an embodiment of the delta-sigma modulator 15. In FIG. 2, an analog voltage Vin is applied to a terminal 40 for provision to an integration circuit 41. The integration circuit 41 includes an input resistor 42, a feedback resistor 43, an integration capacitor 44, and an operational amplifier 45. The integration circuit 41 integrates a difference obtained by subtracting the output voltage of an operational amplifier 49 from the analog voltage Vin.

The output signal of the integration circuit 41 is quantized by a comparator comprised of an operational amplifier 46. A D-type flip-flop 47 delays the quantized signal by one clock cycle for transmission from a terminal 48. The output of the terminal 48 is fed back to the integration circuit 41 via the operational amplifier 49 constituting a one-bit DA converter.

<Signal Timing Chart>

Figure 3:
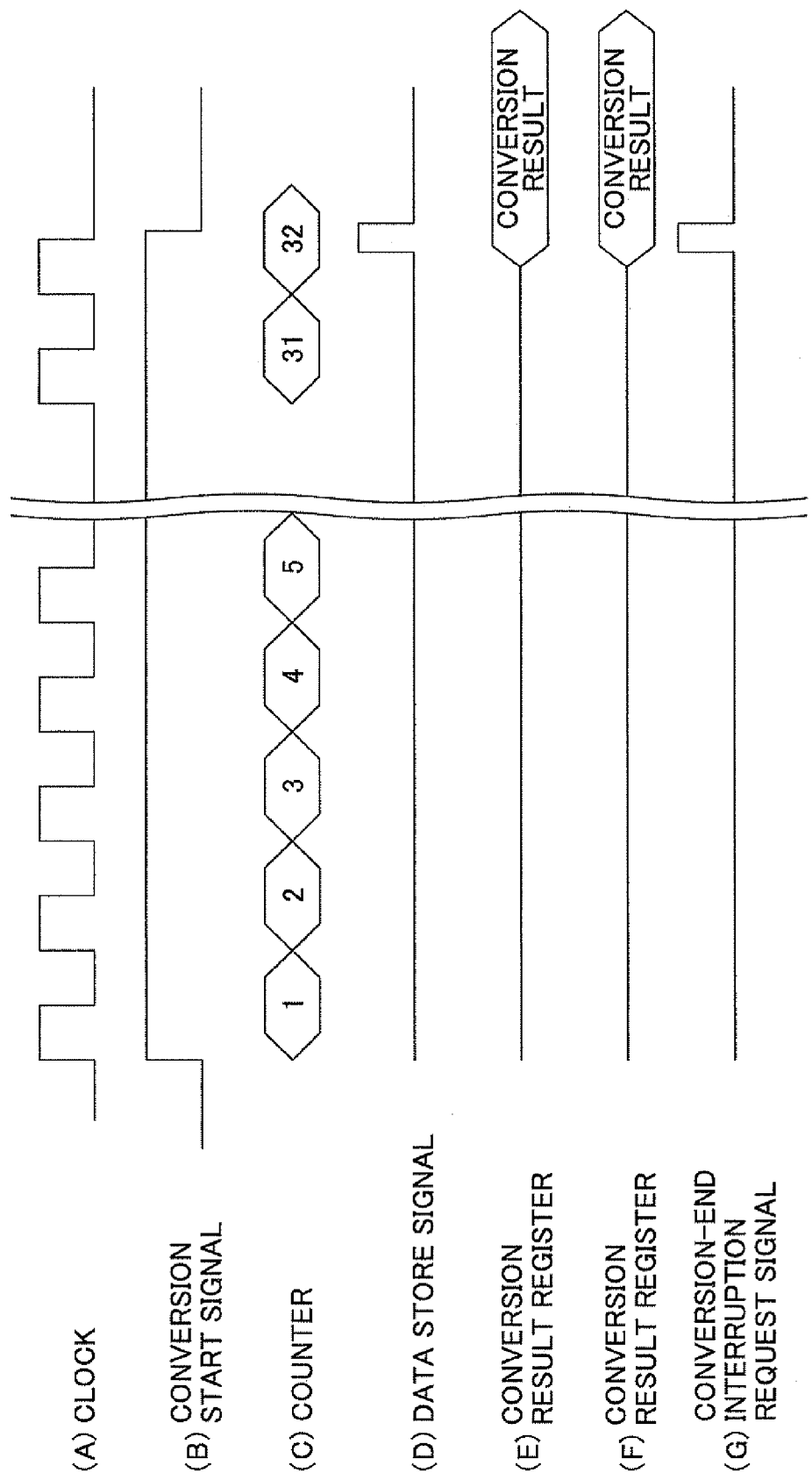
FIG. 3 is a signal timing chart in the case of the 32-bit mode.

FIG. 3 is a signal timing chart in the case of the 32-bit mode. Upon the conversion start signal illustrated in FIG. 3-(B) changing to a high level, the conversion bit counter 19 starts counting the clock pulses illustrated in FIG. 3-(A). Upon counting 32 pulses as illustrated in FIG. 3-(C), the conversion bit counter 19 generates a data store signal illustrated in FIG. 3-(D) and the conversion-end interruption request signal illustrated in FIG. 3-(G).

As a result, the upper 16 bits and lower 16 bits of the shift register 18 are stored in the conversion result registers 21 and 22 as illustrated in FIG. 3-(E) and (F), respectively. Further, the CPU 30 reads the pulse density modulated data from the conversion result registers 21 and 22 in response to the conversion-end interruption request signal illustrated in FIG. 3-(G).

In the example illustrated in FIG. 3, the conversion start signal illustrated in FIG. 3-(B) is changed to a low level by the conversion-end interruption request signal because the settings of the control register 13 indicate the resetting of the conversion start signal. In the case of the settings indicating no resetting of the conversion start signal, the conversion start signal maintains its high level despite the supply of the conversion-end interruption request signal, so that the conversion bit counter 19 starts counting from one again.

Figure 4:
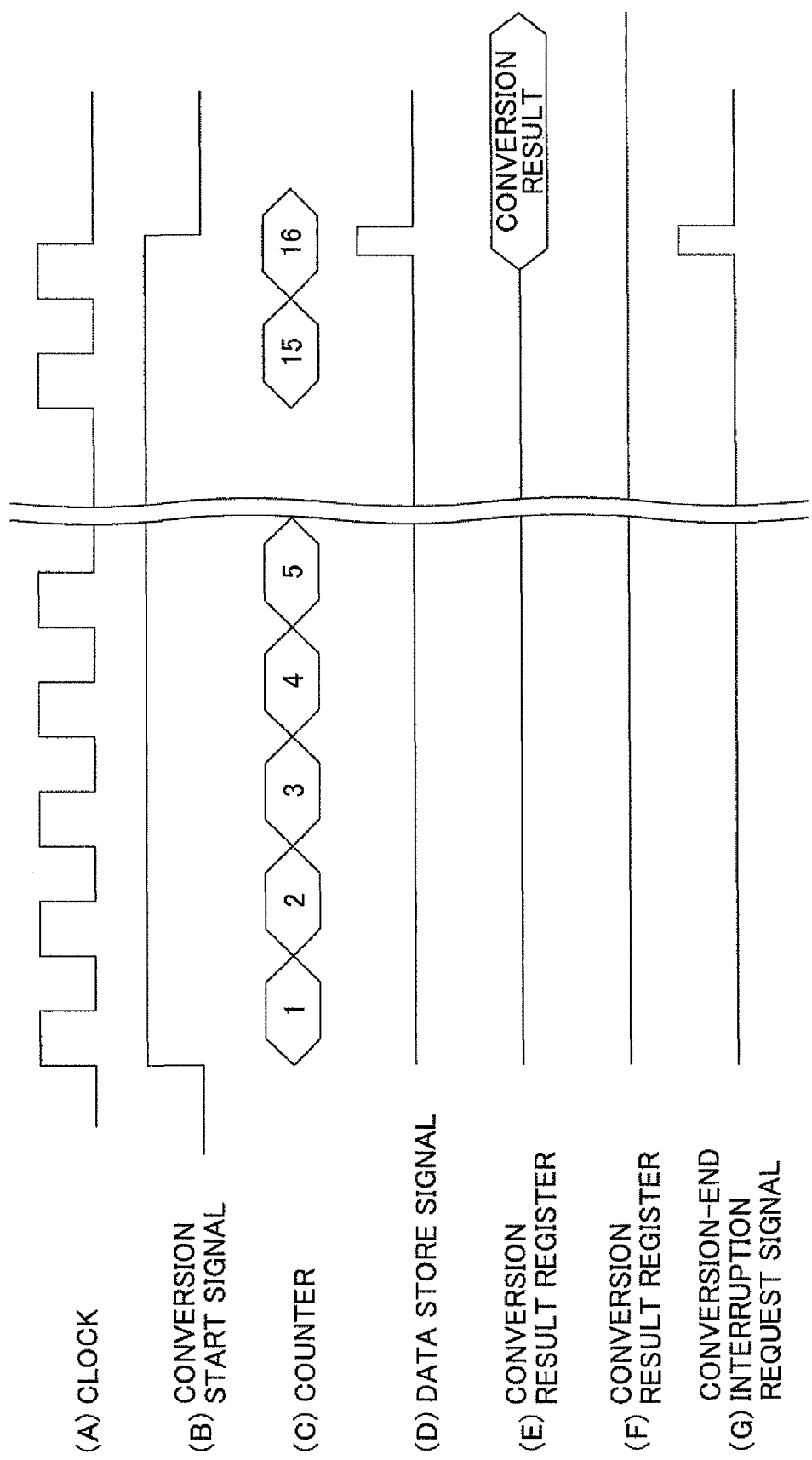
FIG. 4 is a signal timing chart in the case of the 16-bit mode.

FIG. 4 is a signal timing chart in the case of the 16-bit mode. Upon the conversion start signal illustrated in FIG. 4-(B) changing to a high level, the conversion bit counter 19 starts counting the clock pulses illustrated in FIG. 4-(A). Upon counting 16 pulses as illustrated in FIG. 4-(C), the conversion bit counter 19 generates a data store signal illustrated in FIG. 4-(D) and the conversion-end interruption request signal illustrated in FIG. 4-(G).

As a result, the upper 16 bits of the shift register 18 are stored in the conversion result register 21 as illustrated in FIG. 4-(E). Further, the CPU 30 reads the pulse density modulated data from the conversion result register in response to the conversion-end interruption request signal illustrated in FIG. 4-(G).

In the example illustrated in FIG. 4, the conversion start signal illustrated in FIG. 4-(B) is changed to a low level by the conversion-end interruption request signal because the settings of the control register 13 indicate the resetting of the conversion start signal. In the case of the settings indicating no resetting of the conversion start signal, the conversion start signal maintains its high level despite the supply of the conversion-end interruption request signal, so that the conversion bit counter 19 starts counting from one again.

In the manner described above, the number of bits of the pulse density modulated data supplied from the modulation unit 10 of the delta-sigma AD converter circuit to the CPU 30 is increased when the CPU 30 is operating at high speed. Further, the number of bits of the pulse density modulated data supplied from the modulation unit 10 to the CPU 30 is decreased when the CPU 30 is operating at low speed.

<Battery Pack>

Figure 5:
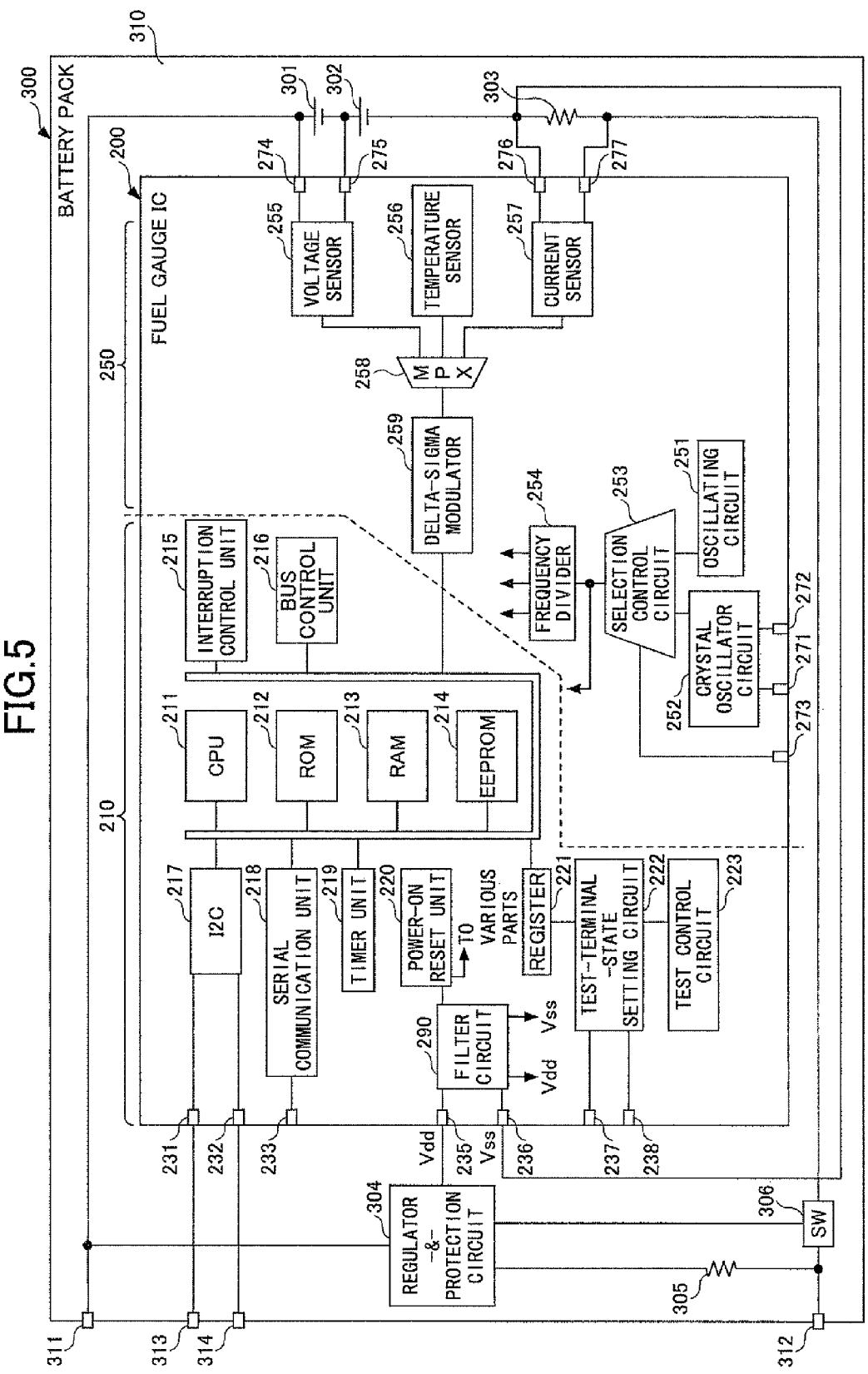
FIG. 5 is a block diagram illustrating an embodiment of a battery pack to which a fuel gauge IC is applied.

FIG. 5 is a block diagram illustrating an embodiment of a battery pack to which a fuel gauge IC is applied. In FIG. 5, a fuel gauge IC 200 includes a digital part 210 and an analog part 250.

The digital part 210 includes a CPU 211, a ROM 212, a RAM 213, an EEPROM 214, an interruption control unit 215, a bus control unit 216, an I2C unit 217, a serial communication unit 218, a timer unit 219, a power-on reset unit 220, a register 221, a test-terminal-state setting circuit 222, a test control circuit 223, and a filter circuit 290. The CPU 211, the ROM 212, the RAM 213, the EEPROM 214, the interruption control unit 215, the bus control unit 216, the I2C unit 217, the serial communication unit 218, the timer unit 219, and the register 221 are connected to each other via an internal bus.

The CPU 211 corresponds to the CPU 30 of FIG. 1, and the ROM 212 corresponds to the memory 31 of FIG. 1. The interruption control unit 215 corresponds to the interruption control unit 35 of FIG. 1.

The CPU 211 executes programs stored in the ROM 212 to control the entirety of the fuel gauge IC 200. The CPU 211 performs processing such as calculating a remaining battery level by integrating the charge and discharge currents of the battery. For this purpose, the RAM 213 is used as a work area. The EEPROM 214 stores trimming information and the like.

The interruption control unit 215 receives interruption requests from various parts of the fuel gauge IC 200. The interruption control unit 215 generates an interruption according to the priority levels of interruption requests, and notifies the CPU 211. The bus control unit 216 controls which circuit unit uses the internal bus.

The I2C unit 217 is connected to communication lines via ports 231 and 232 to perform two-line serial communication.

The serial communication unit 218 is connected to a communication line (not shown) via a port 233 to perform one-line serial communication.

The timer unit 219 counts a system clock. This count is stored in the RAM 211. The power-on reset unit 220 detects a rise in a power supply Vdd supplied to a port 235 to which the power-on reset unit 220 is connected via the filter circuit 290, thereby generating a reset signal. The reset signal is supplied to various parts of the fuel gauge IC 200.

The register 221 receives information transferred from the EEPROM 214. The test-terminal-state setting circuit 222 connects between test terminals 237 and 238 and the test control circuit 223 in response to information stored in the register 221. The test-terminal-state setting circuit 222 sets inputs into the test control circuit 223 corresponding to the test ports 237 and 238 to predetermined levels.

Upon receiving the inputs from the test ports 237 and 238, the test control circuit 223 changes the state of an internal circuit in response to these inputs. As a result of this, the testing of the internal circuit of the fuel gauge IC 200 becomes possible.

The analog part 250 includes an oscillating circuit 251, a crystal oscillator circuit 252, a selection control circuit 253, a frequency divider 254, a voltage sensor 255, temperature sensor 256, a current sensor 257, a multiplexer 258, and a delta-sigma modulator 259. The delta-sigma modulator 259 corresponds to the modulation unit 10 of FIG. 1.

The oscillating circuit 251 is an oscillator having a PLL to produce an oscillating signal of a few MHz. The crystal oscillator circuit 252 oscillates with a crystal oscillator externally attached to ports 271 and 272 to produce an oscillating signal of a few MHz. The oscillating frequency of the crystal oscillator circuit 252 has higher precision than that of the oscillating circuit 251.

The selection control circuit 253 selects one of the oscillating frequency signals output from the oscillating circuit 251 and the crystal oscillator circuit 252 based on a select signal supplied from a port 273. The selected oscillating frequency signal is supplied to various parts of the fuel gauge IC 200 as a system clock, and is also supplied to the frequency divider 254. The selection control circuit 253 also generates a reset signal RST and a control signal ONT. The selection control circuit 253 selects the oscillating frequency signal output from the oscillating circuit 251, for example, when no select signal is supplied from the port 273. The frequency divider 254 generates various clocks by dividing the frequency of the system clock for provision to various parts of the fuel gauge IC 200.

The voltage sensor 255 detects the voltages of batteries 301 and 302 externally attached to ports 274 and 275, respectively, to supply an analog detected voltage to the multiplexer 258. The temperature sensor 256 detects the ambient temperature of the fuel gauge IC 200 to supply an analog detected temperature to the multiplexer 258.

The opposite ends of a current-detection-purpose resistor 303 are connected to ports 276 and 277, respectively. The current sensor 257 detects a current flowing through the resistor 303 based on a potential difference between the ports 276 and 277. The current sensor 257 supplies an analog detected current to the multiplexer 258.

The multiplexer 258 successively selects the analog detected voltage, the analog detected temperature, and the analog detected current for provision to the delta-sigma modulator 259. The delta-sigma modulator 259 performs delta-sigma conversion with respect to each detected value to supply pulse density modulated data to the CPU 211 via the internal bus. The CPU 211 performs digital filtering to digitize the detected voltage, the detected temperature, and the detected current. Further, the CPU 211 calculates a remaining battery level by integrating the charge and discharge currents of the battery. In so doing, the detected temperature is used for temperature compensation.

The fuel gauge IC 200 described above is accommodated in a case 310 together with the batteries 301 and 302, the current-detection-purpose resistor 303, a regulator-&-protection circuit 304, a resistor 305, and a switch 306, thereby forming a battery pack 300. A terminal 311 of the battery pack 300 is connected to the positive pole of the battery 301 and the power supply input terminal of the regulator-&-protection circuit 304. The power supply output terminal of the regulator-&-protection circuit 304 is connected to the power-supply-Vdd port 235 of the fuel gauge IC 200. A terminal 312 is connected to the ground terminal of the regulator-&-protection circuit 304, and is also connected via the switch 306 to a connection point between the current-detection-purpose resistor 303 and the port 277. The regulator-&-protection circuit 304 stabilizes the voltage between the terminals 311 and 312, and also turns off the switch 306 for protection purposes when this voltage falls out of a predetermined range.

A connection point between the current-detection-purpose resistor 303 and the port 276 is connected to the power-supply-Vss port 236 of the fuel gauge IC 200. Terminals 313 and 314 of the battery pack 300 are connected to the ports 231 and 233 of the fuel gauge IC 200, respectively.

Further, the present invention is not limited to these embodiments, but various variations and modifications may be made without departing from the scope of the present invention.

The present application is based on priority application No. 2009-006162 filed with the Japanese Patent Office, the entire contents of which are hereby incorporated by reference.

DESCRIPTION OF REFERENCE SYMBOLS 11-1 to 11-*n* terminal
12 multiplexer
13 control register
15 delta-sigma modulator
16 sub-clock internal oscillator
17 frequency divider
18 shift register
19 conversion bit counter
21, 22 conversion result register
30 CPU
31 memory
35 interruption control unit

The invention claimed is:

1. A delta-sigma AD converter circuit, comprising:
a modulation unit to produce pulse density modulated data by pulse density modulation of an analog signal; and
a filtering unit to convert the pulse density modulated data into pulse code modulated data,
wherein the modulation unit includes:
a shift register to store and shift the pulse density modulated data in synchronization with a clock, said shift register having a bit width;
a counter to generate a register store instruction signal and a read request signal upon a count value reaching a predetermined value responsive to a mode, the count value being a count of a number of shifts of the shift register; and
a plurality of conversion result registers to store plural data obtained by dividing data stored in the shift register and to hold the plural data in such a form that each of the plural data is readable independently of the others,
wherein each register comprising said plurality of conversion result registers has a bit width that is less than the bit width of said shift register,
wherein each register comprising said plurality of conversion result registers stores a portion of the pulse density modulated data stored in the shift register in response to the register store instruction signal, and the filtering unit reads the pulse density modulated data from one or more of the plurality of conversion result registers according to the mode, in response to the read request signal.

2. The delta-sigma AD converter circuit as claimed in claim 1, wherein the mode is set by the filtering unit.

3. The delta-sigma AD converter circuit as claimed in claim 1, wherein the modulation unit includes a reset circuit that resets, according to a setting made by the filtering unit, a conversion start signal requesting an operation of the counter upon receiving the read request signal from the counter.

4. The delta-sigma AD converter circuit as claimed in claim 1, wherein the filtering unit reads the pulse density modulated data of a first bit width in a case of the mode being a first mode, and reads the pulse density modulated data of a second bit width different from the first bit width in a case of the mode being a second mode.

5. The delta-sigma AD converter circuit as claimed in claim 1, wherein one or more of the plurality of conversion result registers store the pulse density modulated data of a first bit width in a case of the mode being a first mode, and store the pulse density modulated data of a second bit width different from the first bit width in a case of the mode being a second mode.

6. The delta-sigma AD converter circuit as claimed in claim 1, wherein the filtering unit is a CPU.

7. A battery pack, comprising:
a battery;
a current sensor to detect charge and discharge currents of the battery;
a delta-sigma modulator to produce pulse density modulated data by pulse modulation of an analog signal generated by the current sensor; and
a CPU to obtain digital values of the charge and discharge currents based on the pulse density modulated data,
wherein the delta-sigma modulator includes:
a shift register to store and shift the pulse density modulated data in synchronization with a clock, said shift register having a bit width;
a counter to generate a register store instruction signal and a read request signal upon a count value reaching a predetermined value responsive to a mode, the count value being a count of a number of shifts of the shift register; and
a plurality of conversion result registers to store plural data obtained by dividing data stored in the shift register and to hold the plural data in such a form that each of the plural data is readable independently of the others,
wherein each register comprising said plurality of conversion result registers has a bit width that is less than the bit width of said shift register,
wherein each register comprising said plurality of conversion result registers stores a portion of the pulse density modulated data stored in the shift register in response to the register store instruction signal, and wherein the CPU reads the pulse density modulated data from one or more of the plurality of conversion result registers according to the mode, in response to the read request signal, and calculates a remaining battery level of the battery based on the digital values of the charge and discharge currents obtained based on the read pulse density modulated data.

8. The battery pack as claimed in claim 7, wherein the mode is set by the CPU.

9. The battery pack as claimed in claim 7, wherein the delta-sigma modulator includes a reset circuit that resets, according to a setting made by the CPU, a conversion start signal requesting an operation of the counter upon receiving the read request signal from the counter.

10. The battery pack as claimed in claim 7, wherein the CPU reads the pulse density modulated data of a first bit width in a case of the mode being a first mode, and reads the pulse density modulated data of a second bit width different from the first bit width in a case of the mode being a second mode.

11. The battery pack as claimed in claim 7, wherein one or more of the plurality of conversion result registers store the pulse density modulated data of a first bit width in a case of the mode being a first mode, and store the pulse density modulated data of a second bit width different from the first bit width in a case of the mode being a second mode.

* * * * *